(12) United States Patent
Yamazaki et al.

(10) Patent No.: US 7,977,867 B2
(45) Date of Patent: Jul. 12, 2011

(54) ORGANIC EL PANEL

(75) Inventors: Takuro Yamazaki, Kawasaki (JP); Kohei Nagayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 311 days.

(21) Appl. No.: 12/135,728

(22) Filed: Jun. 9, 2008

(65) Prior Publication Data
US 2008/0309235 A1 Dec. 18, 2008

(30) Foreign Application Priority Data

Jun. 13, 2007 (JP) .................. 2007-155872
May 8, 2008 (JP) .................. 2008-121997

(51) Int. Cl.
*H01L 51/50* (2006.01)
(52) U.S. Cl. .................. 313/504; 313/512; 428/690
(58) Field of Classification Search .......... 313/500–512; 428/690
See application file for complete search history.

(56) References Cited

U.S. PATENT DOCUMENTS

| 6,307,528 | B1 * | 10/2001 | Yap ................................. 345/45 |
| 6,758,538 | B2 | 7/2004 | Fujita et al. .................. 313/506 |
| 7,417,373 | B2 * | 8/2008 | Yamazaki ..................... 313/506 |
| 2005/0225238 | A1 * | 10/2005 | Yamazaki ..................... 313/506 |
| 2006/0192487 | A1 | 8/2006 | Choi et al. .................... 313/512 |
| 2007/0182322 | A1 | 8/2007 | Nagayama .................... 313/509 |
| 2007/0273271 | A1 | 11/2007 | Yamazaki et al. ............. 313/504 |
| 2008/0042559 | A1 | 2/2008 | Yamazaki ..................... 313/504 |

FOREIGN PATENT DOCUMENTS

| JP | 2002-108250 | 4/2002 |
| JP | 2006-236963 | 9/2006 |

* cited by examiner

*Primary Examiner* — Nimeshkumar D Patel
*Assistant Examiner* — Mary Ellen Bowman
(74) *Attorney, Agent, or Firm* — Fitzpatrick, Cella, Harper & Scinto

(57) ABSTRACT

A top-emission type organic EL panel has a substrate carrying thin film transistors formed thereon, a plurality of organic EL devices formed on the substrate, each of the organic EL devices including a reflecting electrode, organic compound layers and a transparent electrode arranged in this order from the substrate side, a device separation layer formed in a space separating adjacently located organic EL devices, a protective layer covering the organic EL devices and the device separation layer and a light-shielding layer formed on the protective layer in a display region other than light emitting sections of the organic EL devices so as to be held in contact with the protective layer and cover at least part of lateral surfaces of the device separation layer.

3 Claims, 2 Drawing Sheets

ORGANIC EL PANEL

BACKGROUND OF THE INVENTION

1. Field of the Invention

This invention relates to a top-emission type organic EL (electroluminescent) panel having an organic EL device formed by sequentially laying a reflecting electrode, organic compound layers and a transparent electrode on a substrate where a thin film transistor is formed and a protective layer covering the organic EL device. More particularly, the present invention relates to an organic EL panel designed to prevent the thin film transistor from being degraded by light.

2. Description of the Related Art

Massive efforts are being paid to develop organic EL devices. The organic EL device driving system is roughly classified into a passive matrix system and an active matrix system. However, in order to realize a large screen with high definition, an active matrix system with use of a thin film transistor is being developed.

While amorphous silicon and poly silicon that are being employed to form thin film transistors have light susceptibility and hence there is a problem that some of the characteristics of thin film transistors can be changed and/or degraded when they are hit by light coming from organic EL devices and external light.

Japanese Patent Application Laid-Open No. 2002-108250 describes a technique of forming a light-shielding layer that directly covers the thin film transistors on a substrate.

There is another problem about organic EL devices that light striking the organic EL devices is reflected by the reflecting electrodes and some of the undulations of the devices to fall the contrast ratio of the organic EL panel.

Japanese Patent Application Laid-Open No. 2006-236963 discloses a technique of arranging a black adhering member on the device separation layer so as to expose the EL devices of an organic EL panel.

Since Japanese Patent Application Laid-Open No. 2002-108250 describes a technique of forming a light-shielding layer that directly covers the thin film transistors, the technique can prevent some of the characteristics of thin film transistors from being changed or degraded by incident light.

The light-shielding layer may be formed by using a black inorganic insulating layer or a layer that is by turn formed by dispersing a black pigment or a black die in resin. However, the following problem can arise when such a light-shielding material is employed.

Since the light-shielding layer is held in contact with thin film transistors, the light-shielding layer is sandwiched between the thin film transistors and an electro-conductive member when an electro-conductive member is arranged on the light-shielding layer. Then, if the light-shielding layer is formed by using a metal material or a material illustrating a large relative permittivity, the light-shielding layer is electrically charged to produce a capacitance, which by turn changes or degrades some of the characteristics of the thin film transistors.

In short, while the technique of Japanese Patent Application Laid-Open No. 2002-108250 can prevent some of the characteristics of thin film transistors from being changed or degraded by incident light, those characteristics of thin film transistors are changed or degraded due to the fact that a light-shielding layer is held in contact with thin film transistors in an organic EL panel.

Thus, there is not known any practical light-shielding technique for effectively covering thin film transistors.

The technique of Japanese Patent Application Laid-Open No. 2006-236963 can improve the contrast ratio of an organic EL panel by covering the region thereof other than the light emitting regions by means of a black material because the black material operates like a black matrix.

However, since the device separation layer is tapered at the lateral surfaces thereof, which are then smoothly connected to the respective light emitting regions, external light that strikes the lateral surfaces of the device separation layer, which is part of light trying to enter the EL panel, is reflected and simply goes out. Therefore, when the lateral surfaces of the device separation layer are not covered by a black material but exposed, the contrast ratio of the organic EL panel can fall so much. In short, the technique of Japanese Patent Application Laid-Open No. 2006-236963 is not satisfactory for improving the contrast ratio of an organic EL panel because light striking the lateral surfaces of the device separation layer is reflected to become a cause of making the contrast ratio fall.

SUMMARY OF THE INVENTION

Therefore, the object of the present invention is to provide an organic EL panel having a light-shielding arrangement that can shield the thin film transistors thereof from light and provide an effect of improving the contrast ratio without lowering the drive characteristic thereof.

According to the present invention, the above object is achieved by providing a top-emission type organic EL panel having: a substrate carrying thin film transistors formed thereon; a plurality of organic EL devices formed on the substrate, each of the organic EL devices including a reflecting electrode, organic compound layers and a transparent electrode arranged in this order from the substrate side; a device separation layer formed in a space separating adjacently located organic EL devices; a protective layer covering the organic EL devices and the device separation layer; and a light-shielding layer formed on the protective layer in a display region other than light emitting sections of the organic EL devices so as to be held in contact with the protective layer and cover at least part of lateral surfaces of the device separation layer.

The organic EL panel according to the present invention is made to have a light-shielding layer formed separately from electronic devices in the regions where the reflecting electrodes are not arranged and hence external light is not partly blocked, or the display region of the organic EL devices other than the light emitting sections thereof. Thus, some of the characteristics of the electronic devices are not changed or degraded. In other words, the organic EL panel according to the present invention can shield the electronic devices from light without lowering the drive characteristic thereof.

Additionally, the organic EL panel according to the present invention is made to have a light-shielding layer formed to cover the lateral surfaces of the device separation layer thereof. Therefore, the area of the lateral surfaces of the device separation layer that external light strikes can be reduced to by turn improve the contrast ratio of the organic EL panel.

Furthermore, any damages to the organic EL devices can be minimized as a result of forming the light-shielding layer on and in contact with a protective layer. Thus, any possible fall of the drive characteristic of the organic EL panel that arises due to the arrangement of a light-shielding layer can be minimized.

Further features of the present invention will become apparent from the following description of exemplary embodiments with reference to the attached drawings.

DESCRIPTION OF THE EMBODIMENTS

Now, the present invention will be described in greater detail by referring to the accompanying drawings that illustrate an exemplary embodiment of organic EL panel according to the present invention.

Figure 1:
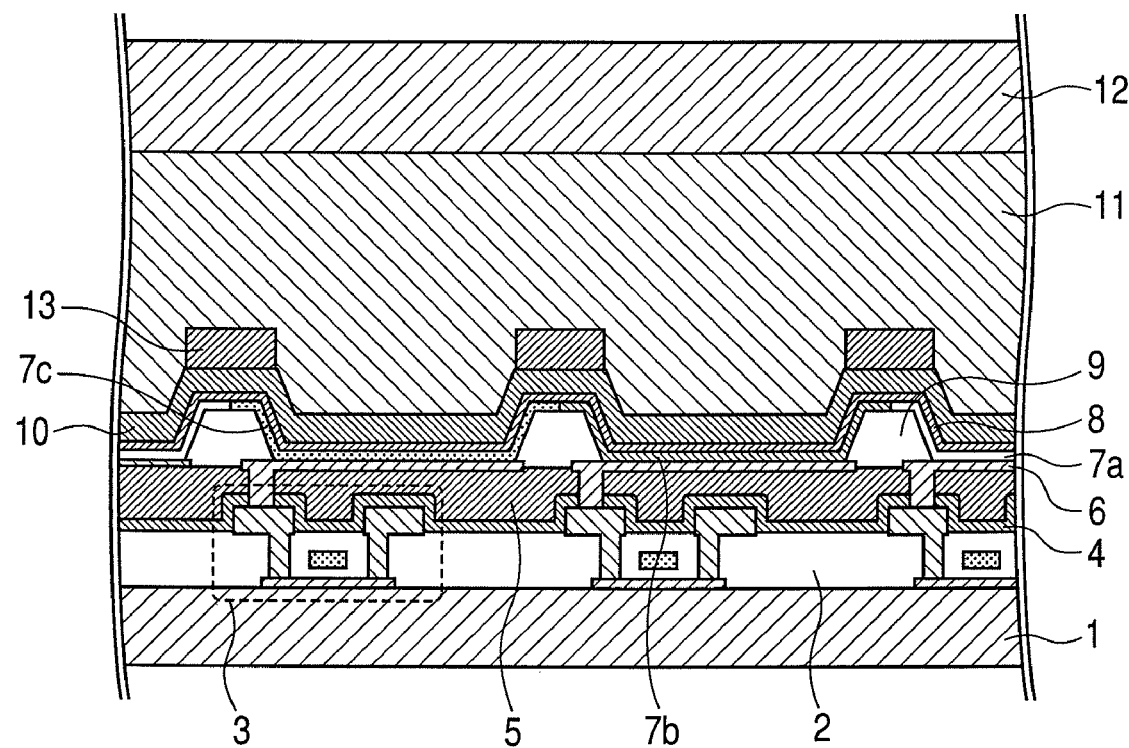
FIG. 1 is a schematic cross sectional view of an organic EL panel according to the present invention.

FIG. 1 is a schematic cross sectional view of the embodiment of organic EL panel according to the present invention. Referring to FIG. 1, the embodiment has a substrate 1, a gate insulating layer 2, electronic devices (thin film transistors, switching devices in particular) 3, an insulating layer 4 covering the electronic devices, organic flattening layers 5, first electrodes (reflecting electrodes) 6 and organic compound layers 7a, 7b and 7c. The embodiment also has second electrodes (transparent electrodes) 8, a device separation layer 9, a protective layer 10, an intermediate layer 11, a protective member 12 and a light-shielding layer 13.

In other words, the organic EL panel of this embodiment is a top emission type organic EL panel having a device separation layer 9 for electrically separating adjacently located organic EL devices, each having a reflecting electrode 6, organic compound layers 7a, 7b and 7c and a transparent electrode 8 laid sequentially on the substrate 1 on which the electronic devices 3 are formed, and a protective layer 10 covering the organic EL devices.

Particularly, a light-shielding layer 13 is formed on and in contact with the protective layer 10 in the display region of the organic EL devices other than the light emitting sections thereof. In short, while rays of light emitted from the organic EL devices and rays of incident light from the outside (external light) are exclusively blocked by the reflecting electrodes 6 on the electronic devices 3, part of external light is not blocked and enters the electronic devices 3 from the respective regions of the devices where no reflecting electrodes 6 are arranged, or the display region other than the light emitting sections of the organic EL devices. Thus, a light-shielding layer 13 is formed on the display regions of the organic EL devices other than the light emitting sections and separated from the electronic devices 3. Therefore, the characteristics of the electronic devices 3 are neither changed nor degraded so that the drive characteristic of the organic EL panel is not lowered and the electronic devices can be blocked from light.

Additionally, since the light-shielding layer 13 is formed as large as possible so as to at least partly cover the lateral surfaces of the device separation layer 9, the area of the lateral surfaces exposed to incoming external light is reduced to by turn minimize the area of the lateral surfaces of the device separation layer 9 that reflect external light.

The light-shielding layer 13 is preferably formed so as to cover the lateral surfaces of the contact hole sections formed in the organic flattening layers 5 in order to electrically connect the electronic devices 3 and the respective corresponding first electrodes 6 as illustrated in FIG. 1 because external light reflected by the lateral surfaces of the contact hole sections can reduce the contrast ratio like external light reflected by the lateral surfaces of the device separation layer 9.

Thus, the light-shielding layer of this embodiment is highly effective because reflection of light at the device separation layer and the contact hole sections can hardly be eliminated by means of any anti-external-light-reflection members such as circularly polarizing members.

Now, the configuration of the above organic EL panel will be described in greater detail below.

The substrate 1 has electronic devices 3 for controlling the respective organic EL devices. The electronic devices 3 are so-called active matrix type switching devices.

The electronic devices 3 are arranged below the organic EL devices. Since the electronic devices 3 and the organic EL devices are not arranged on a single plane, the organic EL devices are provided with a sufficient planar area to advantageously raise the aperture ratio.

The reflecting electrodes 6 are electrodes formed by using a material selected from Al, Cr, Ag, ITO and IZO. The transparent electrodes 8 are electrodes formed by using IZO or ITO.

A plurality of organic EL devices, each having a pair of electrodes of the above described types and organic compound layers, are arranged and each of the organic EL devices is controlled for emission or non-emission of light. Thus, the organic EL devices are operated as so many pixels. The organic EL panel can be utilized for a display or alternatively for a lighting apparatus.

The device separation layer 9 is interposed between adjacent organic EL devices. The device separation layer 9 may be formed by using a resin material such as polyimide or acryl or an inorganic material such as SiN or SiOH.

The device separation layer 9 is required to have lateral surfaces that have a small angle of inclination and are smoothly connected to the respective reflecting electrodes 6. If the lateral surfaces are standing sharp and upright relative to the reflecting electrodes, no organic compound layer is formed on the lateral surfaces and the reflecting electrodes and the corresponding respective transparent electrodes can be short-circuited to produce non-light-emitting pixels. Therefore, the angle of inclination of the lateral surfaces of the device separation layers relative to the respective reflecting electrodes 6 is preferably not greater than 50°, more preferably not less than 40°.

A protective layer (passivation layer) 10 is arranged on the organic EL devices so as to cover at least the entire regions where the organic EL devices are formed and also the end sections of the substrate. Thus, the organic EL devices will never be exposed to oxygen and moisture. The organic EL devices can be exposed to oxygen and/or moisture when the organic EL panel is the final product being used by the user or somewhere in the manufacturing process.

The protective layer 10 is a film containing Si as principal ingredient. More specifically, the protective layer 10 is a film containing at least one of the elements of O, N, H and F and preferably has a thickness of not less than 0.5 μm. The protective layer 10 may be a multilayer film of two or more than two layers having different compositions. Depending on the characteristics that the protective layer is required to illustrate, the protective layer 10 may be a multilayer film of an inorganic film and an organic film.

A light-shielding layer 13 is formed on and held in contact with the protective layer 10. The region where the light-shielding layer 13 is formed is the display region other than the regions of the light emitting sections of the organic EL devices. In other words, the region where the light-shielding layer 13 is formed is the plane and intra-planar region of the organic EL panel where the device separation layer 9 is formed. It is sufficient for the light-shielding layer 13 to be formed to such an extent that the light-shielding layer 13 can satisfactorily shield the electronic devices 3 and cover at least part of the lateral surfaces of the device separation layer 9. Preferably, the light-shielding layer 13 is formed on the device separation layer 9 so as to surround the light emitting sections of all the organic EL devices and cover the lateral surfaces of the device separation layer 9 as much as possible.

Figure 2:
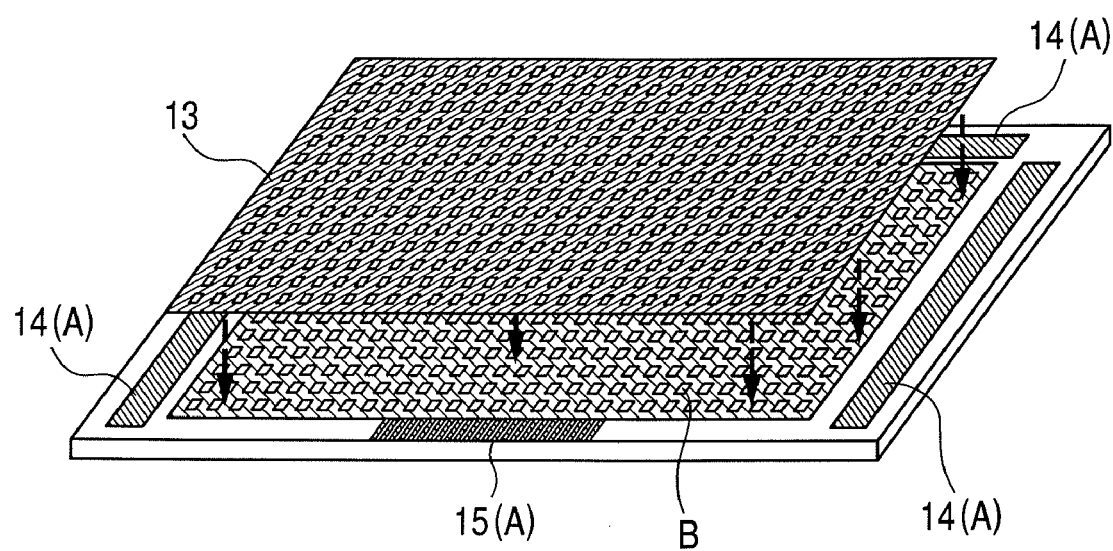
FIG. 2 is schematic illustration of the region where a light-shielding layer is formed.

FIG. 2 is a schematic illustration of the region where the light-shielding layer 13 is formed.

The region where the organic EL devices are arranged in the display region is indicated by B. Thus, the region B exists in intra-planar directions of the substrate. On the other hand, the region where no organic EL devices are formed is indicated by A. The region A is located outside the region B.

Peripheral circuit sections 14 are arranged respectively along three of the four sides of the region A. A plurality of electronic devices are arranged in the peripheral circuit sections 14. The electronic devices may typically be thin film transistors (TFTs) and arranged outside the region where the organic EL devices are arranged in order to control the organic EL devices that are components of the organic EL panel according to the present invention.

A lead-out electrode 15 is arranged along the remaining side of the region B and in the region A.

In the illustrated instance, the light-shielding layer 13 is arranged in the region B other than the regions where the light emitting sections of the organic EL devices are arranged. However, note that, while the light-shielding layer 13 may be arranged so as to cover the entire region B except the light emitting sections of the organic EL devices, the light-shielding layer 13 is sufficient for the light-shielding layer 13 to be arranged at positions where it can at least shield the electronic devices 3 formed in the region B.

Alternatively, the light-shielding layer 13 may be formed continuously to the region A. If such is the case, the light-shielding layer 13 may be arranged so as to cover all the peripheral circuit sections 14 and also the lead-out electrode 15 or alternatively the light-shielding layer 13 may be arranged so as to cover at least one of the peripheral circuit sections 14.

The light-shielding layer 13 may be formed by using any material so long as the light transmission factor of not higher than 10% relative to light within a wavelength range not less than 350 nm and not more than 800 nm. Examples of materials that can be used to form the light-shielding layer 13 include $SiO_2$, $Al_2O_3$, $TiO_2$, carbon-containing resins, and electro-conductive materials including metals such as Cr, Si and Al. Note, however, that the reflectance of the light-shielding layer is preferably not higher than 30% because the effect of reducing reflection of external light of the light-shielding layer is not satisfactory when the reflectance thereof is high. Materials that provide both a light-shielding effect and an effect of reducing reflection and hence preferably can be used for the light-shielding layer include black materials such as carbon-containing resins and molybdenum oxide films.

Since the material that is used for the light-shielding layer is generally an electro-conductive material or a material containing an electro-conductive material, the distance separating the electronic devices 3 and the light-shielding layer 13 is preferably not less than 1 μm so that the electronic devices 3 may not be adversely affected by the provision of the light-shielding layer 13. In the case of ordinary organic EL devices, the total of the thicknesses of the electrodes and the organic compound layer is about 0.05 μm to 0.5 μm and the thickness of the organic flattening layer is about 0.5 μm to 3 μm so that the thickness of the protective layer 10 is preferably not less than 0.5 μm.

On the other hand, if the distance between the electronic devices 3 to the light-shielding layer 13 is too large, light that enters the panel obliquely can get to some of the electronic devices without being blocked by the light-shielding layer. Additionally, light can come into the organic EL panel through the lateral surfaces of the device separation layer and those of the contact hole sections to make the improvement of the contrast ratio difficult. Therefore, the distance from the electronic devices 3 to the light-shielding layer 13 is preferably not more than 7 μm. In the case of ordinary organic EL devices, the thickness of the device separation layer is preferably about 0.3 μm to 3 μm and the thickness of the protective layer 10 is preferably not less than 6.15 μm.

Thus, the distance from the electronic devices 3 to the light-shielding layer 13 is preferably not less than 1 μm and not more than 7 μm.

Since the light-shielding layer 13 is arranged above the protective layer 10 and at the side of leading out light just like the transparent electrodes 8, the light-shielding layer 13 can prevent external light heading for the substrate 1 side from the side of the transparent electrodes 8, or the viewer's side, from entering any of the electronic devices 3. Then, as a result, the electric characteristics of the electronic devices 3 can be maintained without being adversely affected by the presence of external light.

Note that the gap separating the light-shielding layer 13 and the electronic devices 3 is small if compared, for example, with an arrangement where the light-shielding layer 13 is formed on the protective member 12, the light-shielding effect relative to obliquely entering light is practically not lost.

On the other hand, rays of light emitted from the organic EL devices are blocked by the reflecting electrodes 6 and hence do not enter the electronic devices 3. Thus, as a result, the electric characteristics of the electronic devices 3 can be maintained without being adversely affected by the presence of light emitted from the organic EL devices.

Additionally, the light-shielding layer 13 that broadly covers the lateral surfaces of the device separation layer 9 provides a light-shielding effect against rays of light emitted from the organic EL devices and reflected inside the organic EL panel.

Any method can be used for forming the light-shielding layer 13 so long as the method can produce a pattern that surrounds the light emitting sections of the organic EL devices. However, selection of a patterning process using photoresist provides an advantage that the organic EL devices are not damaged by the process because the protective layer 10 has a moisture-proof effect. The light-shielding layer 13 can also be formed by high definition printing or ink-jet printing. In short, a light-shielding layer 13 can be formed on a large substrate with ease at low cost.

With any process selected for forming a light-shielding layer, the possible damage to the organic EL devices can be minimized by holding the formed light-shielding layer in contact with the protective layer 10 and so is the fall of the drive characteristic of the organic EL panel due to the process of forming the light-shielding layer 13.

A protective member 12 is additionally arranged above the protective layer 10 and the light-shielding layer 13. The protective member 12 is a member provided to protect the organic EL devices against any external pressure. The protective member 12 is typically made of glass. The protective member 12 may be a circularly polarizing member in addition to being a glass-made transparent member.

An intermediate layer 11 is arranged between the protective member 12 and the protective layer 10. The intermediate layer 11 is typically made of resin. The resin of the intermediate layer 11 may be set or highly viscous.

The present invention is described above by way of the embodiment of organic EL panel. An organic EL panel according to the present invention can find various applications in the field of lighting, displays for electronic appliances and back lights for display apparatus. Examples of displays for electronic appliances to which an organic EL panel according to the present invention is applicable include television sets, displays of personal computers, back display sections of image pickup apparatus, display sections of portable telephone sets and display sections of portable game machines. Other examples of displays to which an organic EL panel according to the present invention is applicable include display sections of portable music replay apparatus, display sections of portable information terminals (PDAs) and display sections of car navigation systems.

EXAMPLES

Now, the embodiments of the present invention will be described further below by way of examples.

Example 1

This example will be described below by referring to FIGS. 1 and 2.

In this example, organic EL panels as illustrated in FIG. 1 were prepared and the light emitting characteristics thereof were evaluated under sunlight and in a dark room.

The organic EL panels of this example were prepared in the following way. A gate insulating layer 2, electronic devices 3, peripheral circuit sections 14 where a plurality of electronic devices is formed, a lead-out electrode 15, an insulating film 4 covering the electronic devices 3 and a drive circuit section of an organic flattening layer 5 were formed on a large glass substrate 1. Subsequently, contact holes for connecting the first electrodes 6 to be formed on the organic flattening layer 5 and the electronic devices 3 were formed. Thereafter, the first electrodes 6 were formed. A device separation layer 9 was formed to surround the first electrodes 6 in order to electrically insulate each of the first electrodes from adjacent ones. The device separation layer 9 was tapered at the lateral surfaces thereof to illustrate an angle of inclination of 40°.

In order to see the effect of the light-shielding layer relative to the electronic devices 3 in this example, an about 100 μm light-shielding structure of black resist was arranged relative to the peripheral circuit sections 14 in the region A.

FL03/DpyFL+sDTAB2/DFPH1/DFPH1+$Cs_2CO_3$ was deposited by evaporation on the substrate and organic compound layers 7a, 7b and 7c were formed in the order of a hole transport layer, a light emitting layer, an electron transport layer and an electron injection layer. Then, second electrodes 8 of IZO were formed to a film thickness of 60 nm by sputtering to produce pixels. Then, a silicon nitride film was formed to a film thickness of 5 μm by VHF plasma CVD as protective layer 10 so as to cover the organic flattening layer 5, the first electrodes 6, the organic compound layers 7a, 7b and 7c, the second electrodes 8 and the device separation layer 9. All the process from the step of bringing in the substrate 1 to the step of forming the protective layer 10 was conducted in vacuum.

Then, as illustrated in FIG. 2, a resin black matrix was transferred by printing onto the protective layer 10 in the display region B other than the light emitting sections of the organic EL devices to produce a light-shielding layer 13. The light-shielding layer 13 covered all the display region B other than the light emitting sections of the organic EL devices and not less than 30% of the lateral surfaces of the device separation layer 9. Additionally, the light-shielding layer 13 was a continuous film extending to the boundary with the region A.

The transmission factor of the light-shielding layer 13 of this example was not higher than 1% relative to light of wavelength of 350 nm to 800 nm.

Subsequently, a circularly polarizing plate that was to operate as protective member 12 was bonded above the protective layer 10 and the light-shielding layer 13 with an intermediate layer 11 interposed between them. Finally, organic EL panels as illustrated in FIG. 1 were prepared by scribing from the side of the circularly polarizing plate and cutting it into individual organic EL panels.

The organic EL panels of this example were operated for light emission and display under sunlight of about 50,000 lx and in a dark room to evaluate the display performance thereof. The generation of noise and the changes of tint were minimal, if observed, during the display operation under sunlight. In other words, an organic EL panel according to the present invention displayed quality images under sunlight comparable to images displayed in a dark room. The contrast ratio was about 200:1 in a light place.

Comparative Example 1

Now, the comparative example will be described below by referring to FIG. 3.

Figure 3:
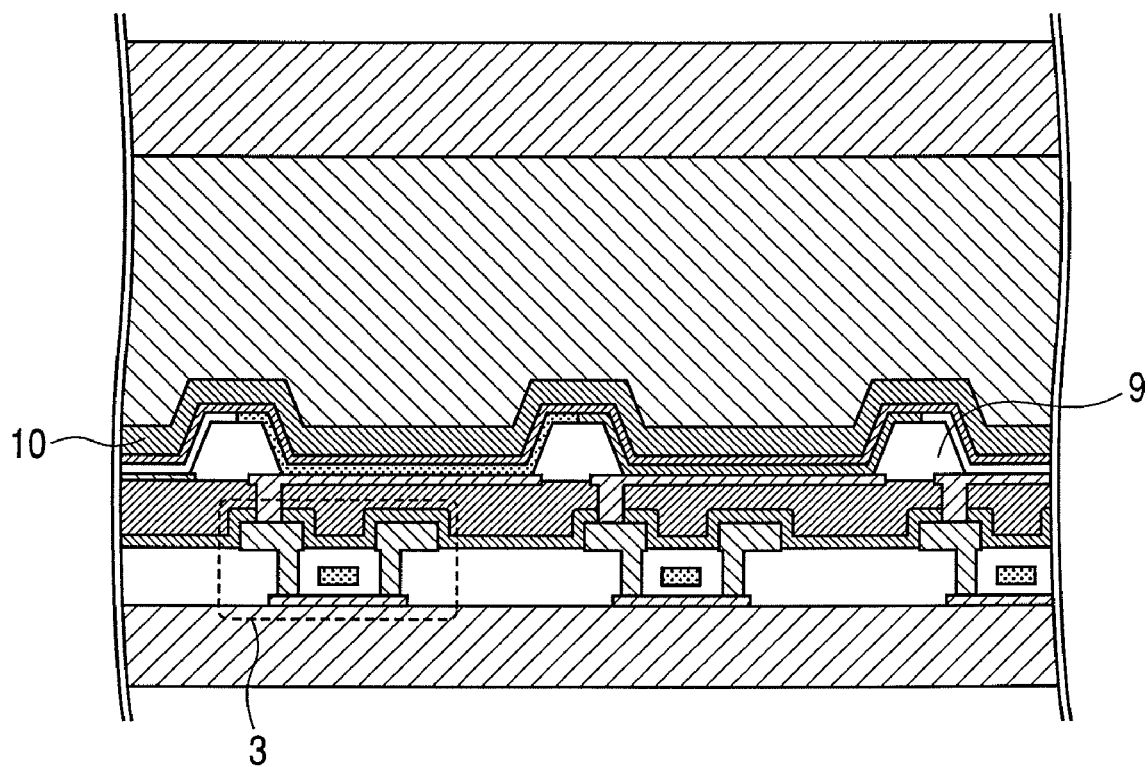
FIG. 3 is a schematic cross sectional view of an organic EL panel to be examined for the purpose of comparison.

Organic EL panels as illustrated in FIG. 3 were prepared in this comparative example and operated to evaluate the display performance thereof under sunlight and in a dark room.

In this comparative example, organic EL panels substantially similar to those of the example 1 were prepared. However, in the region B, no light-shielding layer is formed.

The organic EL panels of this comparative example were operated for light emission and display under sunlight of about 50,000 lx and in a dark room to evaluate the display performance thereof. The organic EL panels of this comparative example illustrate the EL characteristic substantially the same as those of the electric field light emission type display apparatus of Example 1 in a dark room. However, the organic EL panels were accompanied by poor image quality problems including generation of noise and changes of tint under sunlight. In other words, the organic EL panels cannot maintain the quality organic EL panels illustrated in a dark room. The contrast ratio was about as low as 50:1 in a light place.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2007-155872, filed Jun. 13, 2007, and No. 2008-121997, filed May 8, 2008, which are hereby incorporated by reference herein in their entirety.

What is claimed is:

1. An organic EL panel comprising:
a substrate;
a plurality of organic EL devices arranged on the substrate;

a device separation layer arranged in a space separating adjacently located organic EL devices and having an inclined lateral surface;
a protective layer covering the organic EL devices and the device separation layer; and
a light-shielding layer arranged on the protective layer in a display region other than light emitting sections of the organic EL devices and covering the inclined lateral surface of the device separation layer.

2. The organic EL panel according to claim 1, further comprising a transistor arranged on the substrate, wherein the light-shielding layer is made of an electro-conductive material and is provided to have a distance from the transistor of not less than 1 µm and not more than 7 µm.

3. The organic EL panel according to claim 1, wherein the light-shielding layer covers a part of the transistor.

\* \* \* \* \*